(12) United States Patent
Mikoshiba et al.

(10) Patent No.: US 11,872,813 B2
(45) Date of Patent: Jan. 16, 2024

(54) LIQUID DISCHARGE HEAD AND ACTUATOR

(71) Applicant: Seiko Epson Corporation, Tokyo (JP)

(72) Inventors: Masanori Mikoshiba, Shimosuwa-machi (JP); Motoki Takabe, Shiojiri (JP); Masaki Mori, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 61 days.

(21) Appl. No.: 17/558,757

(22) Filed: Dec. 22, 2021

(65) Prior Publication Data
US 2022/0203683 A1 Jun. 30, 2022

(30) Foreign Application Priority Data

Dec. 25, 2020 (JP) ................. 2020-216430

(51) Int. Cl.
*B41J 2/14* (2006.01)
*B41J 2/045* (2006.01)
*H10N 30/20* (2023.01)

(52) U.S. Cl.
CPC ....... *B41J 2/14201* (2013.01); *B41J 2/04581* (2013.01); *H10N 30/20* (2023.02); *B41J 2002/14491* (2013.01)

(58) Field of Classification Search
CPC ................ B41J 2/14201; B41J 2/04581; B41J 2002/14491; B41J 2002/14241; B41J 2002/14419; B41J 2/14233; B41J 2202/11; H10N 30/20; H10N 30/2047; H10N 39/00

See application file for complete search history.

(56) References Cited

U.S. PATENT DOCUMENTS

2005/0068377 A1\* 3/2005 Ishikawa .............. B41J 2/14233
 347/68
2016/0067967 A1 3/2016 Naganuma et al.

FOREIGN PATENT DOCUMENTS

JP 2016-058467 4/2016

\* cited by examiner

*Primary Examiner* — Lisa Solomon
(74) *Attorney, Agent, or Firm* — WORKMAN NYDEGGER

(57) ABSTRACT when one of two positions in a second direction intersecting the first direction is defined as a first position and the other position is defined as a second position from which the shortest distance to the partition wall is shorter than the shortest distance from the first position to the partition wall, the vibrating plate has a first portion corresponding to the first position and a second portion corresponding to the second position, and a surface of the first portion in the first direction is, in the first direction, closer than a surface of the second portion in the first direction.

15 Claims, 11 Drawing Sheets

LIQUID DISCHARGE HEAD AND ACTUATOR

The present application is based on, and claims priority from JP Application Serial Number 2020-216430, filed Dec. 25, 2020, the disclosure of which is hereby incorporated by reference herein in its entirety.

BACKGROUND

1. Technical Field

The present disclosure relates to a liquid discharge head and an actuator.

2. Related Art

Liquid discharge heads in which a vibrating plate discharges liquid filled in pressure chambers from nozzles in response to the vibrating plate being vibrated by piezoelectric elements have been proposed.

A liquid discharge head described in JP-A-2016-58467 includes a pressure-chamber-defining substrate that defines pressure chambers, a vibrating plate that is disposed on a pressure chamber plate, and piezoelectric elements disposed on the vibrating plate.

The vibrating plate is a plate-like member having a flat top and a flat bottom. The vibrating plate has first areas corresponding to openings of the pressure chambers and second areas adjacent to the pressure chamber plate. The first areas bend and deform as the piezoelectric elements bend and deform. The deformation of the second areas is regulated by the pressure-chamber-defining substrate.

To increase the discharge performance of the liquid discharge head, it is effective to increase the deformation efficiency of the vibrating plate. However, the flat bottom of the vibrating plate may fail to achieve desired deformation efficiency.

SUMMARY

According to an aspect of the present disclosure, to solve the above-described problem, a liquid discharge head includes piezoelectric elements, a vibrating plate disposed at a position closer than the piezoelectric elements in a first direction, and a pressure chamber plate disposed at a position closer than the vibrating plate in the first direction, the pressure chamber plate having a partition wall defining pressure chambers. In the respective pressure chambers, when one of two positions in a second direction intersecting the first direction is defined as a first position and the other position is defined as a second position from which the shortest distance to the partition wall is shorter than the shortest distance from the first position to the partition wall, the vibrating plate has a first portion corresponding to the first position and a second portion corresponding to the second position, and a surface of the first portion in the first direction is, in the first direction, closer than a surface of the second portion in the first direction.

According to another aspect of the present disclosure, a liquid discharge apparatus includes a liquid discharge head and a controller configured to control discharge operation of the liquid discharge head.

DESCRIPTION OF EXEMPLARY EMBODIMENTS

1. First Embodiment 1-1. Overall Structure of Liquid Discharge Apparatus 100

Figure 1:
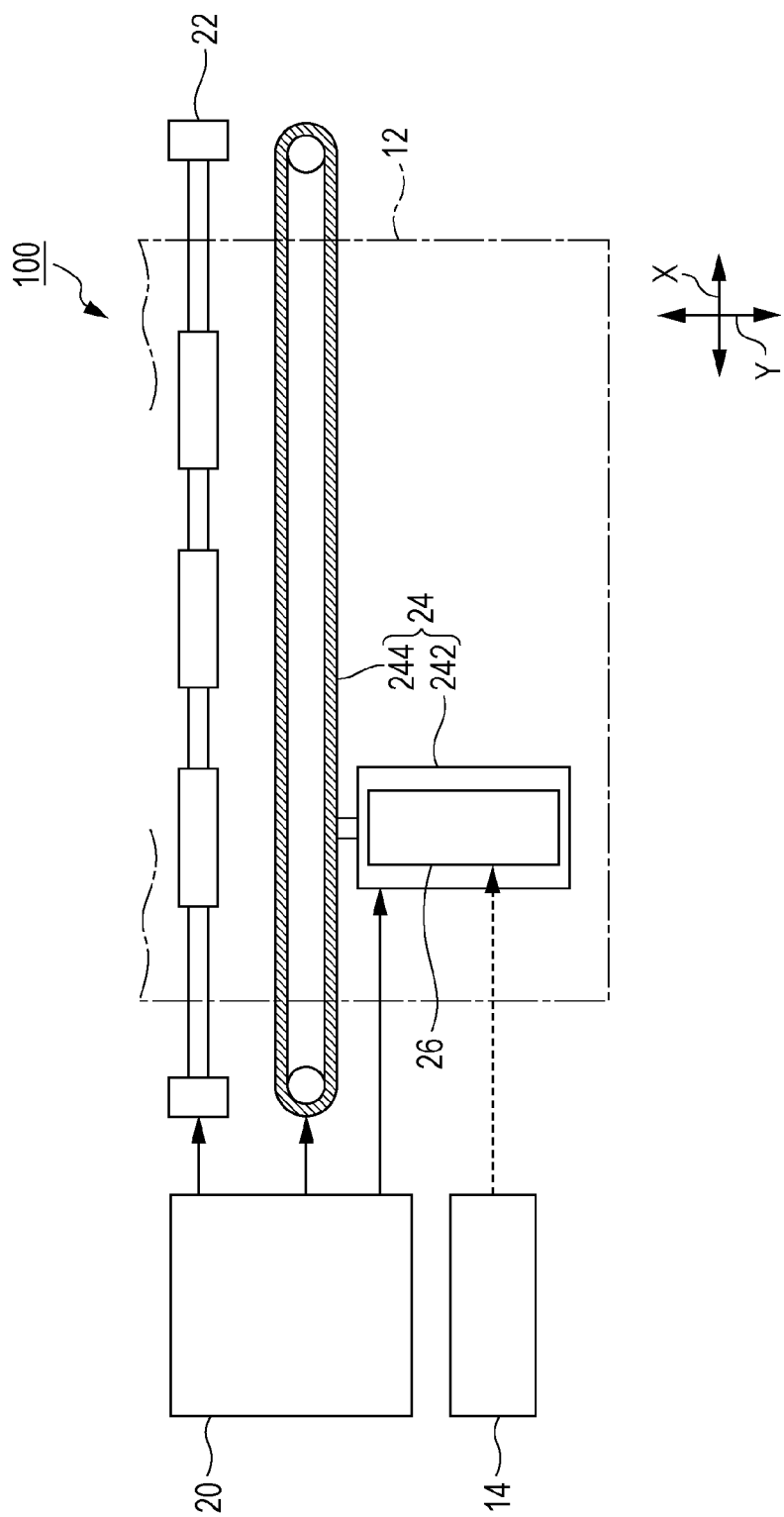
FIG. 1 is a schematic view of a liquid discharge apparatus according to a first embodiment.

FIG. 1 is a schematic view of a liquid discharge apparatus 100 according to the first embodiment. In the description below, for the sake of convenience, the X-axis, Y-axis, and Z-axis that are orthogonal to each other will be used as appropriate. The expression "the same" in this specification allows for errors, such as manufacturing errors.

The liquid discharge apparatus 100 illustrated in FIG. 1 is an ink jet printing apparatus that discharges an ink, which is an example liquid, onto a medium 12. The medium 12 is typically printing paper; alternatively, the medium 12 may be a print target of any material, such as plastic film or cloth. As illustrated in FIG. 1, the liquid discharge apparatus 100 includes a liquid container 14 for storing ink. The liquid container 14 may be a cartridge that is detachably attached to the liquid discharge apparatus 100, a pouch-shaped ink pack made of a flexible film, or an ink tank that can be refilled with an ink.

The liquid discharge apparatus 100 includes a control unit 20, a transport mechanism 22, a moving mechanism 24, and a liquid discharge head 26, as illustrated in FIG. 1. The control unit 20 is an example of a controller for controlling the discharge operation of the liquid discharge head 26. The control unit 20 includes, for example, at least one processing circuit such as a central processing unit (CPU) or a field-programmable gate array (FPGA) and at least one storage circuit such as semiconductor memory. The control unit 20 performs overall control of components in the liquid discharge apparatus 100. The transport mechanism 22 transports a medium 12 parallel to the Y-axis under the control of the control unit 20.

The moving mechanism 24 reciprocates the liquid discharge head 26 parallel to the X-axis under the control of the control unit 20. The moving mechanism 24 includes a substantially box-shaped transport member 242 that accommodates the liquid discharge head 26 and a transport belt 244 to which the transport member 242 is fixed. It should be noted that a plurality of liquid discharge heads 26 may be mounted on the transport member 242, or the liquid container 14 may be mounted on the transport member 242 together with the liquid discharge head 26.

The liquid discharge head 26 discharges an ink supplied from the liquid container 14 through a plurality of nozzles onto a medium 12 under the control of the control unit 20. The liquid discharge head 26 discharges the ink onto the medium 12 simultaneously with the transport of the medium 12 by the transport mechanism 22 and the reciprocation of the transport member 242, thereby forming an image on the medium 12.

1-2. Overall Structure of Liquid Discharge Head 26

Figure 2:
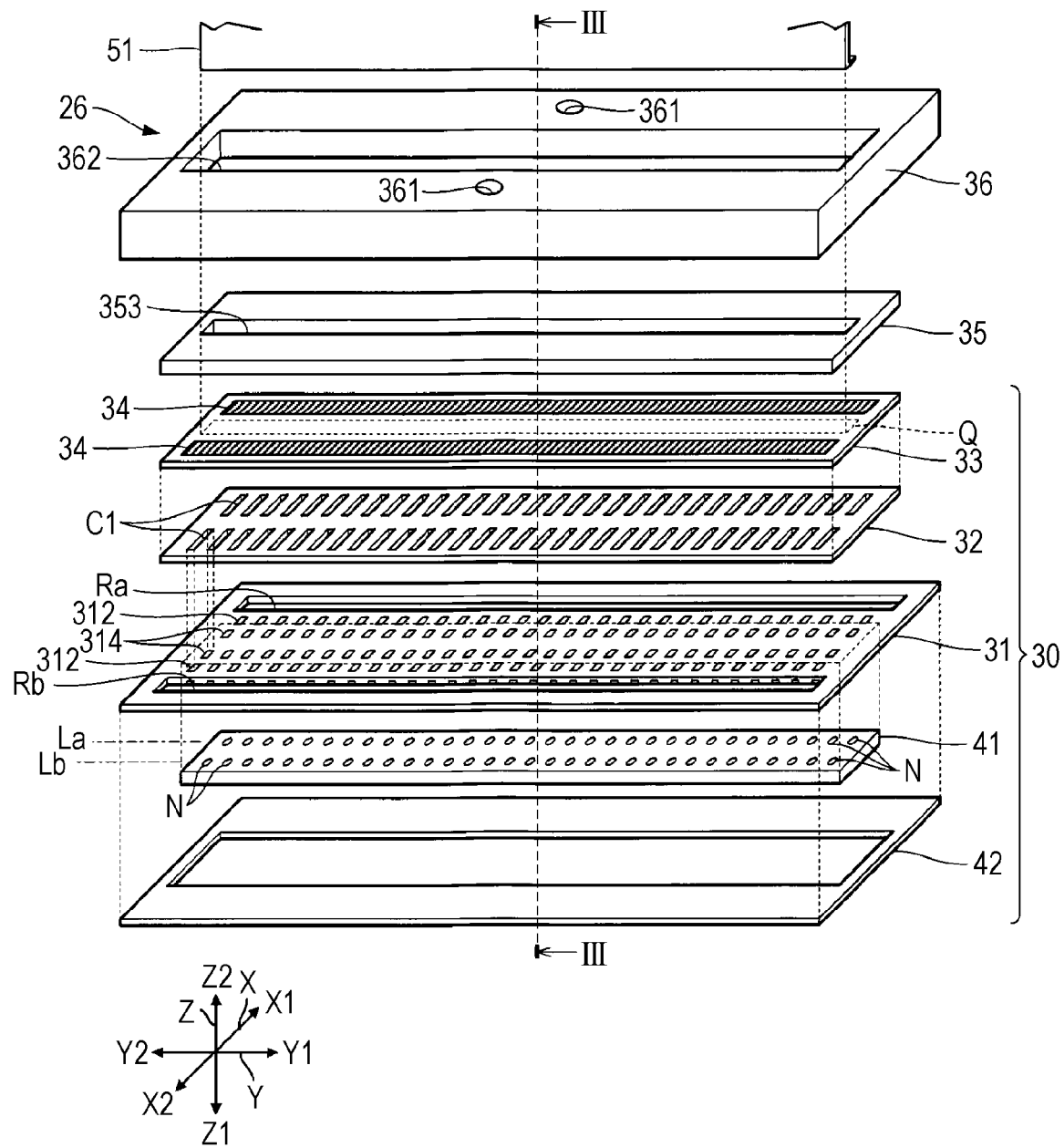
FIG. 2 is an exploded perspective view illustrating a liquid discharge head.
Figure 3:
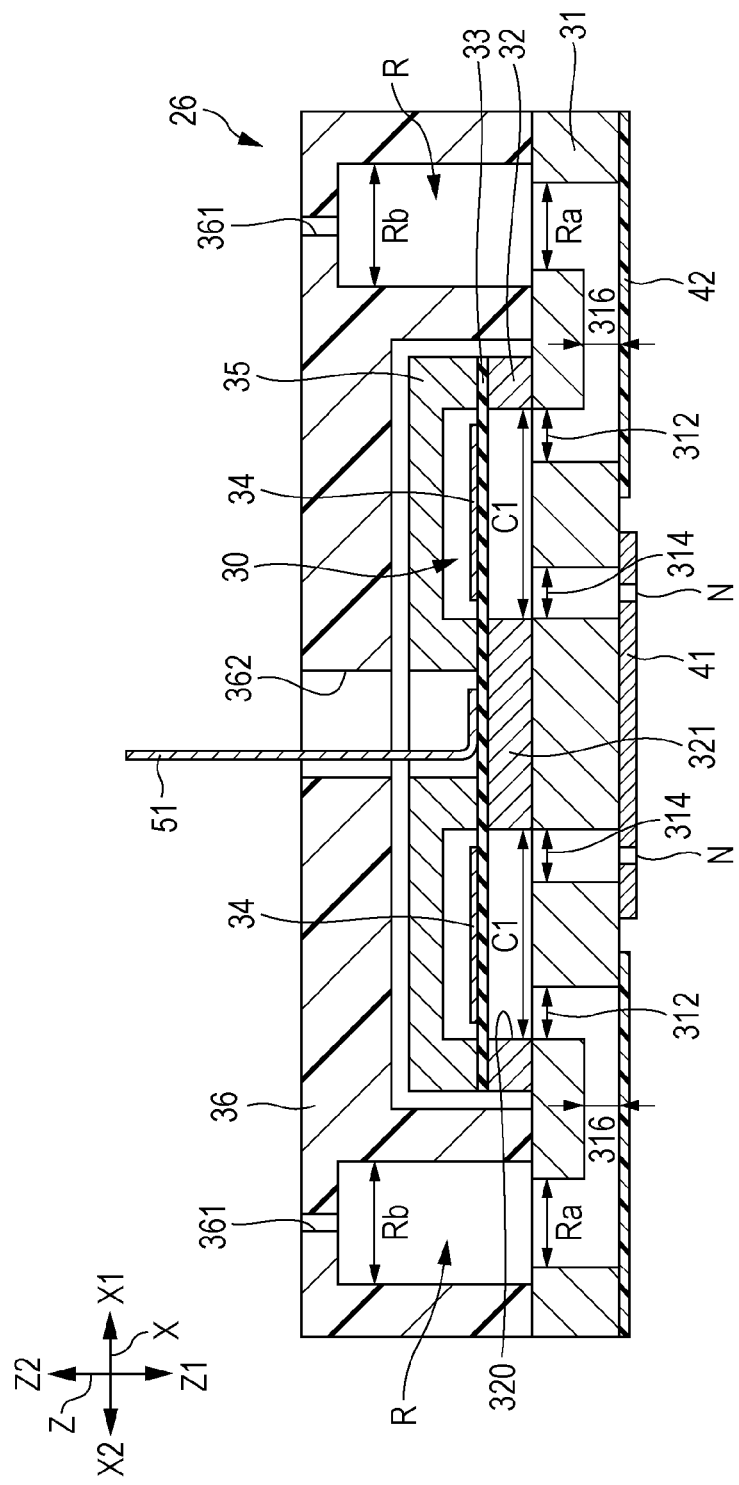
FIG. 3 is a cross view illustrating a liquid discharge head.

FIG. 2 is an exploded perspective view illustrating the liquid discharge head 26. FIG. 3 is a cross-sectional view taken along line III-III in FIG. 2. The Z-axis is an axis extending in a direction in which the liquid discharge head 26 discharges an ink. One direction along the X-axis is referred to as the X1 direction, and the direction opposite to the X1 direction is referred to as the X2 direction. Similarly, one direction along the Y-axis is referred to as the Y1 direction, and the direction opposite to the Y1 direction is referred to as the Y2 direction. One direction along the Z-axis is referred to as the Z1 direction, and the direction opposite to the Z1 direction is referred to as the Z2 direction. A view in the Z1 direction or in the Z2 direction is referred to as "plan view". The Z1 direction corresponds to a "first direction". The Z2 direction corresponds to a "direction opposite to the first direction". The Y1 direction or the Y2 direction corresponds to a "second direction" that intersects the first direction.

The liquid discharge head 26 has a plurality of nozzles N that are arranged parallel to the Y-axis, as illustrated in FIG. 2. The nozzles N illustrated in FIG. 2 are divided into a first line La and a second line Lb that are arranged side by side at a given spacing along the X-axis. Each of the first line La and the second line Lb is a group of nozzles N aligned in the Y2 direction. The liquid discharge head 26 illustrated in FIG. 3 has components corresponding to each nozzle N in the first line La and components corresponding to each nozzle N in the second line Lb arranged substantially symmetrically in a plane. Accordingly, the following descriptions focus on the components corresponding to the first line La, and descriptions of the components corresponding to the second line Lb may be omitted as appropriate.

As illustrated in FIG. 2 and FIG. 3, the liquid discharge head 26 includes a nozzle plate 41, a vibration absorber 42, a flow channel plate 31, a pressure chamber plate 32, a vibrating plate 33, a plurality of piezoelectric elements 34, a sealing member 35, a housing 36, and a wiring board 51. Each of the nozzle plate 41, the vibration absorber 42, the flow channel plate 31, the pressure chamber plate 32, the vibrating plate 33, the sealing member 35, and the housing 36 is a member elongated in the Y2 direction. The nozzle plate 41, the flow channel plate 31, the pressure chamber plate 32, the vibrating plate 33, and the piezoelectric elements 34 are disposed in the Z2 direction in this order. The liquid discharge head 26 also includes an actuator 30. The actuator 30 includes the pressure chamber plate 32, the vibrating plate 33, and the piezoelectric elements 34.

The nozzle plate 41 is a plate member having the nozzles N for discharging ink. Each nozzle N is typically a circular through hole for discharging an ink but may be a through hole of a shape other than circular. The nozzle plate 41 may be fabricated by processing a single crystal substrate of silicon (Si) by using semiconductor manufacturing technologies, such as photolithography and photoetching. It should be noted that any known material and method may be employed to fabricate the nozzle plate 41.

The flow channel plate 31 has a space Ra, a plurality of supply flow channels 312, a plurality of communication flow channels 314, and a relay liquid chamber 316. The space Ra is an elongated opening extending in the Y2 direction. Each of the supply flow channels 312 and the communication flow channels 314 is a through hole that is provided on a per nozzle N basis. The relay liquid chamber 316 is an elongated space that extends across the nozzles N in the Y2 direction to communicate with the space Ra and the supply flow channels 312. Each of the communication flow channels 314 overlaps one nozzle N that corresponds to the communication flow channel 314 in plan view. The flow channel plate 31 may be fabricated by processing a single crystal substrate of silicon by using, for example, semiconductor manufacturing technology.

The pressure chamber plate 32 is disposed at a position closer than the vibrating plate 33 in the Z1 direction. The pressure chamber plate 32 has a partition wall 321. The partition wall 321 defines pressure chambers C1 each storing an ink. The pressure chambers C1 are each provided to a corresponding one of the nozzles N. Although not illustrated, a protective film that protects the pressure chamber plate 32 and the vibrating plate 33 is disposed on the wall surface of the pressure chamber plate 32 defining the pressure chambers C1 to prevent the pressure chamber plate 32 and the vibrating plate 33 from coming into contact with ink.

The vibrating plate 33 is disposed at a position closer than the piezoelectric element 34 in the Z1 direction. The vibrating plate 33 is elastically deformable. The pressure chamber plate 32 and the vibrating plate 33 are separate members in the example illustrated in FIG. 2 and FIG. 3, but portions of the pressure chamber plate 32 and the vibrating plate 33 may be made of the same substrate.

The piezoelectric elements 34 are each provided to a corresponding one of the pressure chambers C1. The piezoelectric element 34 is an elongated passive element extending in the X1 direction in plan view. The piezoelectric element 34 is also a drive element that is driven upon application of a drive signal. The actuator 30, which includes the pressure chamber plate 32, the vibrating plate 33, and the piezoelectric elements 34, will be described in detail later.

The housing 36 is a case for storing an ink to be supplied to the pressure chambers C1 and is formed, for example, by injection molding of a resin material. The housing 36 has a space Rb and a supply port 361. The supply port 361 is a pipeline through which an ink is supplied from the liquid container 14. The supply port 361 communicates with the space Rb. The space Rb in the housing 36 and the space Ra in the flow channel plate 31 communicate with each other. The space consisting of the space Ra and the space Rb functions as a liquid reservoir R for storing an ink to be supplied to the pressure chambers C1. The ink that is supplied from the liquid container 14 passes through the supply port 361 and is stored in the liquid reservoir R. The flow of ink stored in the liquid reservoir R branches from the relay liquid chamber 316 into the supply flow channels 312 and is supplied to the pressure chambers C1 in parallel, thereby refilling the pressure chambers C1 with the ink. The vibration absorber 42 is a flexible film that functions as a wall surface of the liquid reservoir R and absorbs pressure fluctuations of the ink in the liquid reservoir R.

The sealing member 35 protects the piezoelectric elements 34 and reinforces the mechanical strength of the pressure chamber plate 32 and the vibrating plate 33. The sealing member 35 is fixed to the surface of the vibrating plate 33 with, for example, an adhesive. The sealing member 35 accommodates the piezoelectric elements 34 in a concave portion on a side that faces the vibrating plate 33. The wiring board 51 is coupled to a surface of the vibrating plate 33. The wiring board 51 is a mounting component that has a plurality of wires that electrically couple the control unit 20 and the liquid discharge head 26. The flexible wiring board 51 may be, for example, a flexible printed circuit (FPC) or a flexible flat cable (FFC). A drive signal and a reference voltage for driving the piezoelectric elements 34 are supplied from the wiring board 51 to the individual piezoelectric elements 34.

1-3. Actuator 30

Figure 4:
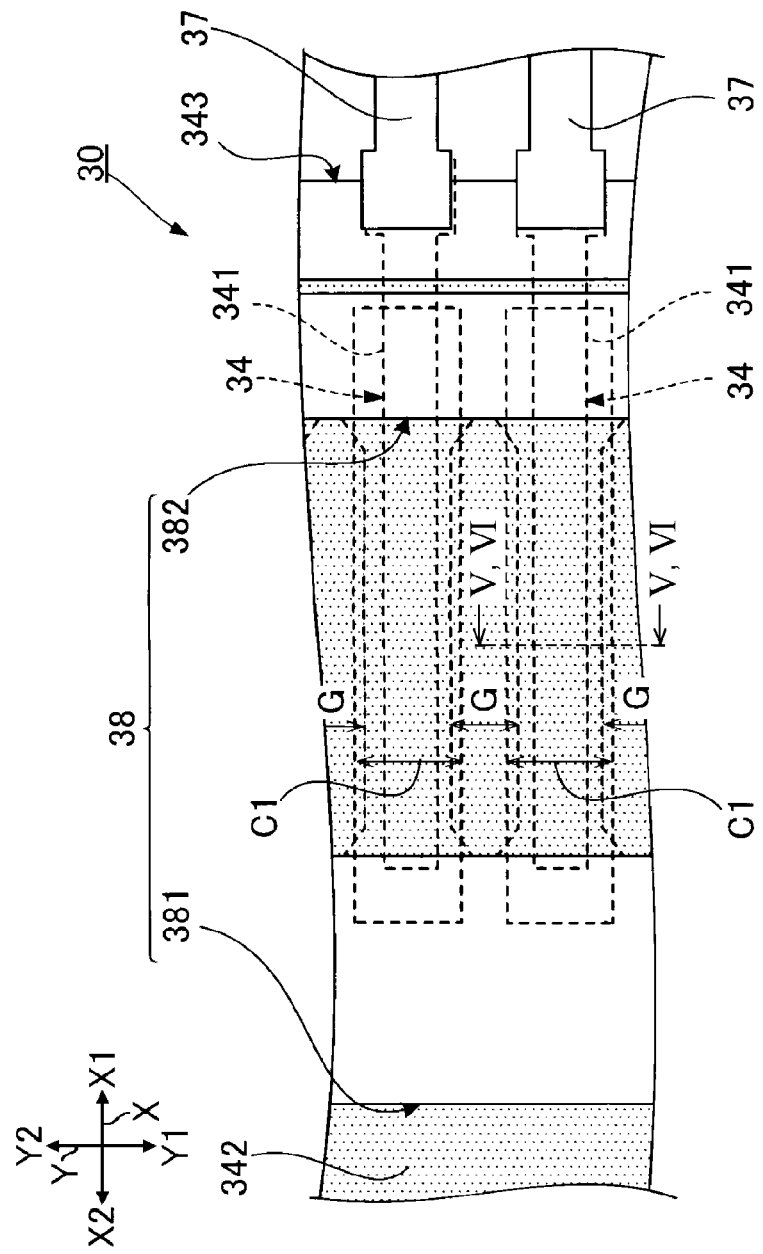
FIG. 4 is a plan view illustrating a part of an actuator.
Figure 5:
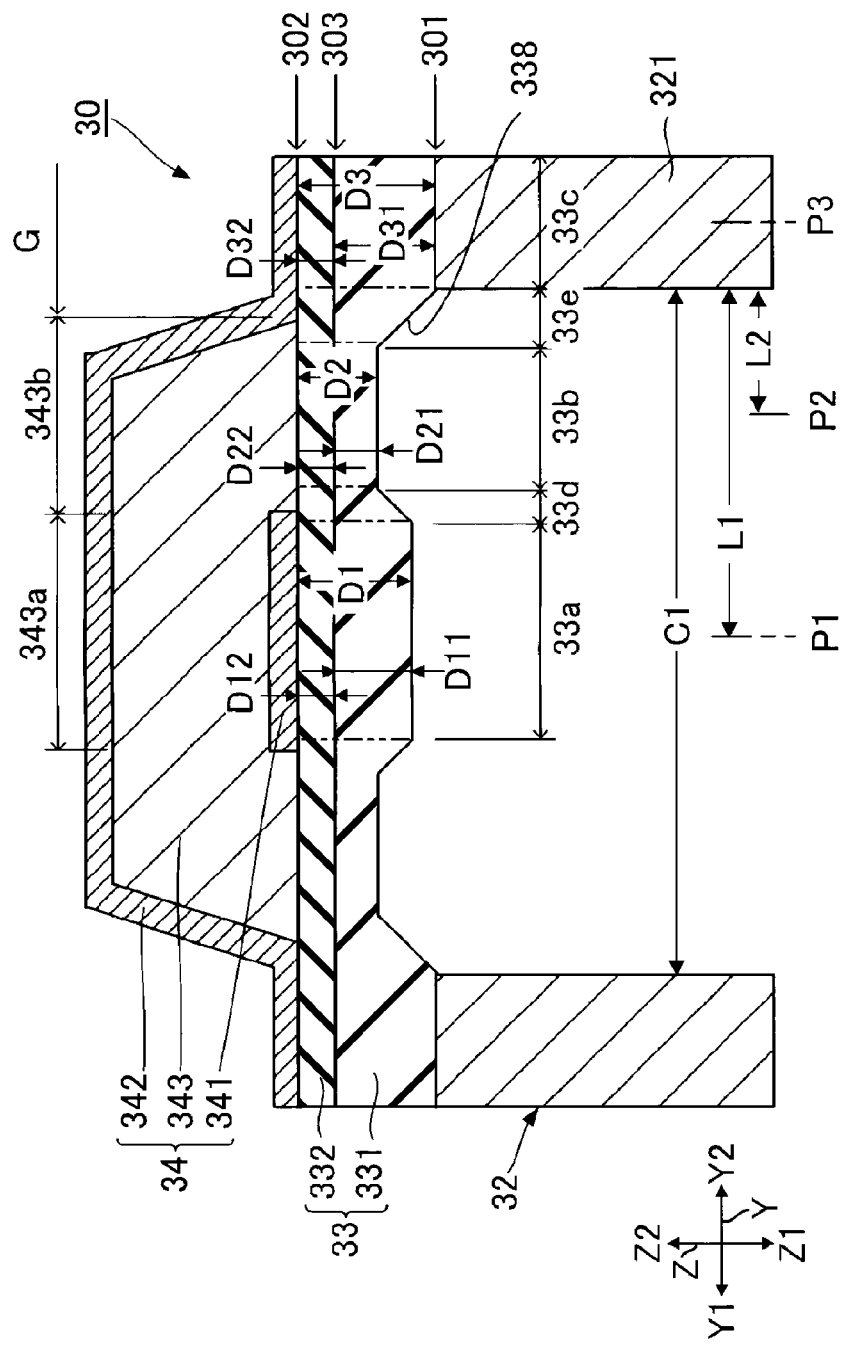
FIG. 5 is a cross-sectional view taken along line V-V in FIG. 3.

FIG. 4 is a plan view illustrating a portion of the actuator 30. FIG. 5 is a cross-sectional view taken along line V-V in FIG. 4. The actuator 30 illustrated in FIG. 4 and FIG. 5 includes the pressure chamber plate 32, the vibrating plate 33, the piezoelectric elements 34, a first line 37, and a second line 38. A second electrode 342 in FIG. 4 is dotted for convenience.

The pressure chamber C1 of the pressure chamber plate 32 illustrated in FIG. 4 is an elongated space extending in the X1 direction in plan view. The pressure chambers C1 are arranged in the Y2 direction. The pressure chamber plate 32 may be fabricated by processing a single crystal substrate of silicon by using, for example, semiconductor manufacturing technology. It should be noted that the shape of the pressure chamber C1 in plan view is not limited to quadrangular as illustrated in FIG. 4 and may be, for example, a parallelogram.

One of two positions in the Y2 direction in a pressure chamber C1 is referred to as a first position P1 and the other position is referred to as a second position P2 in the description below, as illustrated in FIG. 5. The shortest distance L2 from the second position P2 to the partition wall 321 is shorter than the shortest distance L1 from the first position P1 to the partition wall 321. A position in the Y2 direction corresponding to the partition wall 321 is referred to as a third position P3.

The piezoelectric element 34 typically includes a first electrode 341, a piezoelectric layer 343, and the second electrode 342 as illustrated in FIG. 5. The second electrode 342, the piezoelectric layer 343, and the first electrode 341 are disposed in this order in the Z1 direction.

The first electrode 341 has an elongated shape extending in the X1 direction. The first electrodes 341 are arranged at an interval in the Y2 direction as illustrated in FIG. 4. The first electrodes 341 are individual electrodes each provided to a corresponding one of the piezoelectric elements 34 at an interval. The first electrode 341 may contain a conductive material such as aluminum (Al), platinum (Pt), or iridium (Ir). More specifically, the first electrode 341 may include, for example, a layered structure of a Pt layer and an Ir layer. This structure containing any of Al, Pt, and Ir enables the first electrode 341 to have elasticity sufficient to suppress cracking in the piezoelectric layer 343 from occurring while enabling the piezoelectric layer 343 to deform compared with a structure containing none of Al, Pt, and Ir.

The first line 37 is electrically coupled to the first electrode 341 as illustrated in FIG. 4. The first line 37 is a lead to which a drive signal is supplied from a drive circuit (not illustrated) mounted on the wiring board 51 illustrated in FIG. 3. The first line 37 supplies the drive signal to the first electrode 341. The first line 37 is composed of a conductive material that has lower resistance than the first electrode 341. The first line 37 is, for example, a layered structure including a conductive film of gold (Au) on a conductive film of nichrome (NiCr).

The piezoelectric layer 343 deforms in response to application of a voltage to at least one of the first electrode 341 and the second electrode 342, as illustrated in FIG. 5. The piezoelectric layer 343 is a band-shaped dielectric film extending continuously in the Y2 direction across a plurality of piezoelectric elements 34, as illustrated in FIG. 4. Grooves G parallel to the X-axis are provided in areas of the piezoelectric layer 343 that correspond to respective gaps between adjacent pressure chambers C1. The groove G is an opening that passes through the piezoelectric layer 343. The grooves G enable the piezoelectric elements 34 to deform individually for respective pressure chambers C1, resulting in a reduction in propagation of vibration between adjacent piezoelectric elements 34. It should be noted that each groove G may be a blind hole formed by removing a portion of the piezoelectric layer 343 in the thickness direction.

The piezoelectric layer 343 includes an active portion 343a and a non-active portion 343b as illustrated in FIG. 5. The active portion 343a and the non-active portion 343b overlap the pressure chamber C1 in plan view. The active portion 343a is a portion between the first electrode 341 and the second electrode 342. The active portion 343a thus overlaps the first electrode 341 in plan view. The active portion 343a is located at a position corresponding to the first position P1 in the Y2 direction. The active portion 343a, where piezoelectric distortion occurs, is a portion of the piezoelectric layer 343 that overlaps the pressure chamber C1 in plan view. The non-active portion 343b is a portion that is not between the first electrode 341 and the second electrode 342. Accordingly, the non-active portion 343b does not overlap the first electrode 341 in plan view. The non-active portion 343b is located at a position corresponding to the second position P2 in the Y2 direction. The non-active portion 343b, where piezoelectric distortion does not occur, is a portion of the piezoelectric layer 343 that overlaps the pressure chamber C1 in plan view.

The material of the piezoelectric layer 343 may contain a complex oxide that has a perovskite structure represented by the general composition formula $ABO_3$. The material of the piezoelectric layer 343 containing the complex oxide exhibits excellent piezoelectric characteristics compared with the piezoelectric layer 343 that does not contain the complex oxide, thereby enhancing the discharge characteristics. Examples of the material of the piezoelectric layer 343 may include piezoelectric materials, such as lead zirconate titanate ($Pb(Zr, Ti)O_3$), and lead magnesium niobate-lead titanate solid solution ($Pb(Mg, Nb)O_3$—$PbTiO_3$). The piezoelectric layer 343 may be composed of a lead-free material such as sodium potassium niobate (($KNa)NbO_3$) or bismuth sodium titanate (($BiNa)TiO_3$).

The second electrode 342 is a band-shaped common electrode extending continuously in the Y2 direction across a plurality of piezoelectric elements 34, as illustrated in FIG. 4 and FIG. 5. A predetermined reference voltage is applied to the second electrode 342. The reference voltage is a constant voltage and is set to, for example, a voltage higher than a ground voltage. A voltage that corresponds to the difference between the reference voltage applied to the second electrode 342 and the drive signal supplied to the first electrode 341 is applied to the piezoelectric layer 343. It should be noted that the ground voltage may be applied to the second electrode 342. The second electrode 342 may be composed of a conductive material such as aluminum, platinum, or iridium.

As described above, the first electrodes 341 are each provided to a corresponding one of the pressure chambers C1, whereas the second electrode 342 is common to the pressure chambers C1. Accordingly, the piezoelectric layer 343 can be protected by the second electrode 342. When the second electrode 342 is provided individually, a protective layer for protecting the piezoelectric layer 343 is additionally required; however, this structure omits such a protective layer. The second electrode 342 covers the surface of the piezoelectric layer 343 in the Z2 direction. In other words, the second electrode 342 covers the piezoelectric layer 343. The piezoelectric layer 343 and other components are thus protected compared with a structure in which the piezoelectric layer 343 is not covered by the second electrode 342. This structure suppresses deterioration of the piezoelectric layer 343 due to, for example, hydrogen reduction.

The second line 38 is electrically coupled to the second electrode 342 and is disposed at a position further than the second electrode 342 in the Z2 direction, as illustrated in FIG. 4. A reference voltage (not illustrated) is supplied to the second line 38 via the wiring board 51 illustrated in FIG. 3. The second line 38 includes a band-shaped first conductive layer 381 extending in the Y2 direction and a band-shaped second conductive layer 382 extending in the Y2 direction, as illustrated in FIG. 4. The first conductive layer 381 and the second conductive layer 382 are disposed in the X1 direction at a given spacing. The second line 38 functions also as a weight to suppress the vibration of the vibrating plate 33. The second line 38 is a conductive pattern including, for example, a conductive film of gold on a conductive film of nichrome.

In the above-described piezoelectric element 34, the piezoelectric layer 343 deforms in response to application of a voltage to the first electrode 341 and the second electrode 342. The deformation of the piezoelectric element 34 causes the vibrating plate 33 to bend and deform. The vibration of the vibrating plate 33 changes the pressure in the pressure chambers C1 to cause the ink in the pressure chambers C1 to be discharged from the nozzles N illustrated in FIG. 3.

It should be noted that a conductive oxide such as lanthanum nickel oxide (LNO) may be disposed on the first electrode 341 or on the second electrode 342. Additionally, a layer such as a titanium layer may be disposed on the first electrode 341 or on the second electrode 342 as long as the conductivity of the electrode is not impaired. Additionally, a seed layer (not illustrated) may be disposed between the first electrode 341 and the piezoelectric layer 343. The seed layer has a crystal structure that is a seed crystal of the piezoelectric layer 343. The seed layer is an orientation control layer that controls the orientation of the crystal of the piezoelectric layer 343.

The vibrating plate 33 and the pressure chamber plate 32 define the pressure chambers C1, as illustrated in FIG. 5. Portions of the vibrating plate 33 corresponding to the pressure chambers C1 vibrate upon driving of the piezoelectric elements 34.

The vibrating plate 33 includes an elastic layer 331 and an insulating layer 332. The elastic layer 331 is in contact with the pressure chamber plate 32. The elastic layer 331 has, for example, insulation properties. The material of the elastic layer 331 is, for example, silicon dioxide ($SiO_2$). The elastic layer 331 is fabricated by, for example, subjecting one side of a silicon single-crystal substrate to thermal oxidation. The material of the elastic layer 331 is not limited to silicon dioxide and may be another elastic material, such as silicon (Si).

The insulating layer 332 has a composition different from the elastic layer 331 and is disposed further than the elastic layer 331 in the Z2 direction. The insulating layer 332 is disposed between the elastic layer 331 and the first electrode 341 and is in contact with the elastic layer 331 and the first electrode 341. The insulating layer 332 has insulation properties. The material of the insulating layer 332 is an insulating material that contains, for example, any of zirconium (Zr), titanium (Ti), and silicon (Si). More specifically, the material of the insulating layer 332 is, for example, zirconium oxide ($ZrO_2$). The insulating layer 332 is fabricated by, for example, sputtering and thermal oxidation. This insulating layer 332 containing any of Zr, Ti, and Si enables the vibrating plate 33 to have higher mechanical strength while ensuring the amount of deformation required for vibration of the piezoelectric elements 34 compared with the insulating layer 332 containing none of Zr, Ti, and Si. Accordingly, cracking in the vibrating plate 33 can be further suppressed from occurring. The material of the insulating layer 332 may be another insulating material, such as silicon nitride (SiN).

It should be noted that another layer such as a metal oxide layer may be disposed between the elastic layer 331 and the insulating layer 332. The elastic layer 331 and/or the insulating layer 332 may be multiple layers. The vibrating plate 33 may be a single layer instead of the multiple layers.

The vibrating plate 33 includes a first portion 33a, a second portion 33b, a third portion 33c, a first join portion 33d, and a second join portion 33e, as illustrated in FIG. 5. The first join portion 33d corresponds to a "join portion". As illustrated in FIG. 5, in cross-sectional view in the X1 direction, the vibrating plate 33 corresponding to a pressure chamber C1 is symmetric with respect to a virtual line extending in the Z1 direction through a center of the pressure chamber C1. In the description below, mainly the structure on the right side in the drawing with respect to the virtual line will be described.

The first portion 33a, the second portion 33b, the third portion 33c, the first join portion 33d, and the second join portion 33e are aligned in the Y2 direction. The first portion 33a corresponds to the first position P1, the second portion 33b corresponds to the second position P2, and the third portion 33c corresponds to the third position P3. The first join portion 33d is between the first portion 33a and the second portion 33b in the Y2 direction and joins the first portion 33a and the second portion 33b. The second join portion 33e is between the second portion 33b and the third portion 33c in the Y2 direction and joins the second portion 33b and the third portion 33c.

Figure 6:
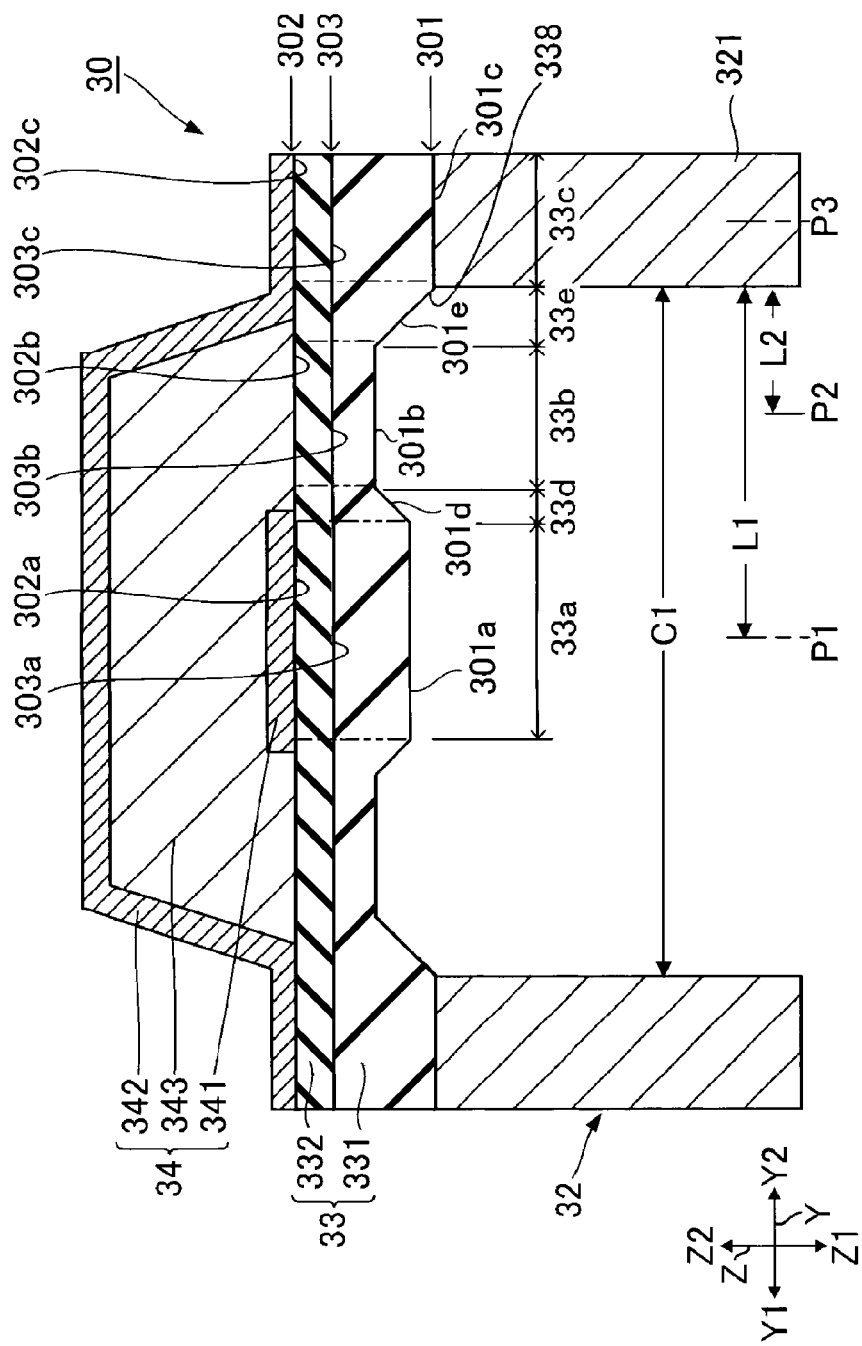
FIG. 6 is a cross-sectional view taken along line VI-VI in FIG. 4.

FIG. 6 is a cross-sectional view taken along line VI-VI in FIG. 4. FIG. 6 focuses on surfaces of the components of the vibrating plate 33, and the structure of the vibrating plate 33 is the same as the structure illustrated in FIG. 5.

The vibrating plate 33 has a surface 301 in the Z1 direction and a surface 302 in the Z2 direction, as illustrated in FIG. 6. The surface 301 of the vibrating plate 33 is also a surface of the elastic layer 331 of the vibrating plate 33 in the Z1 direction. The surface 302 of the vibrating plate 33 is also a surface of the insulating layer 332 of the vibrating plate 33 in the Z1 direction. The insulating layer 332 has a surface 303 in the Z1 direction. The surface 303 is a contact surface of the insulating layer 332 that is in contact with the elastic layer 331.

The surface 301 of the vibrating plate 33 has a recessed portion 338. With this structure, the surface 301 of the vibrating plate 33 in the Z1 direction has steps. The recessed portion 338 is a recess in the surface 301. The recessed portion 338 corresponds to the second position P2 in the Y2 direction.

The surface 301 of the vibrating plate 33 includes surfaces 301a, 301b, 301c, 301d, and 301e. The surface 301a is a surface of the first portion 33a in the Z1 direction and also a surface of the elastic layer 331 of the first portion 33a in the Z1 direction. The surface 301b is a surface of the second portion 33b in the Z1 direction and also a surface of the elastic layer 331 of the second portion 33b in the Z1 direction. The surface 301c is a surface of the third portion 33c in the Z1 direction and also a surface of the elastic layer 331 of the third portion 33c in the Z1 direction. The surface 301d is a surface of the first join portion 33d in the Z1 direction. The surface 301e is a surface of the second join portion 33e in the Z1 direction. The surfaces 301b, 301d, and 301e define the recessed portion 338. The surface 301b is also a bottom of the recessed portion 338.

The surface 302 of the vibrating plate 33 is a continuous flat surface having no step. The surface 302 has a surface 302a of the first portion 33a in the Z2 direction, a surface 302b of the second portion 33b in the Z2 direction, and a surface 302c of the third portion 33c in the Z2 direction.

The surface 303 of the insulating layer 332 is a continuous flat surface having no step. The surface 303 includes a surface 303a, a surface 303b, and a surface 303c. The surface 303a is a surface of the insulating layer 332 of the first portion 33a in the Z1 direction. The surface 303b is a surface of the insulating layer 332 of the second portion 33b in the Z1 direction. The surface 303c is a surface of the insulating layer 332 of the third portion 33c in the Z1 direction.

As described above, the surface 301 has the recessed portion 338 corresponding to the second position P2. Accordingly, the surface 301a of the first portion 33a in the Z1 direction is, in the Z1 direction, closer than the surface 301b of the second portion 33b in the Z1 direction. The recessed portion 338 enables the first portion 33a to have the thickness D1 in the Z1 direction that is greater than the thickness D2 of the second portion 33b in the Z1 direction, as illustrated in FIG. 5. With this structure, the area of the vibrating plate 33 corresponding to the pressure chamber C1, more specifically, the area of the vibrating plate 33 overlapping the pressure chamber C1 in plan view, has the first portion 33a and the second portion 33b each having a different thickness.

The vibrating plate 33 having the first portion 33a and the second portion 33b can enable the vibrating plate 33 to achieve increased deformation efficiency. More specifically, the second portion 33b exhibits relatively large deformation properties when bent. Accordingly, the smaller thickness D2 enables the second portion 33b to deform more readily. In contrast, the first portion 33a moves in the Z1 direction in response to bending but the first portion 33a exhibits no notable deformation. Accordingly, even if the first portion 33a has a smaller thickness D1 similarly to the second portion 33b, the effect of the first portion 33a is limited. Rather, the first portion 33a is effective when the first portion 33a has a greater thickness D1 to enable the surface of the vibrating plate 33 in the Z1 direction to be closer (protrude downward) than the second portion 33b in the Z1 direction to increase the deformation amount of the vibrating plate 33 and to readily press the ink to the nozzle side. The first portion 33a and the second portion 33b according to the embodiment thus increase the deformation efficiency of the vibrating plate 33 compared with the vibrating plate 33 in which the thickness of the vibrating plate 33 is simply uniformly changed. With this structure, the discharge characteristics of the liquid discharge head 26 can be increased.

The active portion 343a of the piezoelectric layer 343 and the first portion 33a are aligned in the Z1 direction, as illustrated in FIG. 5. Accordingly, the first portion 33a and the active portion 343a overlap in plan view. In other words, at least a portion of the first portion 33a is located at the same position as the active portion 343a in the Y1 direction and the Y2 direction. The non-active portion 343b of the piezoelectric layer 343 and the second portion 33b are aligned in the Z1 direction. Accordingly, the second portion 33b and the non-active portion 343b overlap in plan view. In other words, at least a portion of the second portion 33b is located at the same position as the non-active portion 343b in the Y1 direction and in the Y2 direction. This structure in which the first portion 33a and the active portion 343a are aligned in the Z1 direction and the second portion 33b and the non-active portion 343b are aligned in the Z2 direction can increase the deformation efficiency of the vibrating plate 33 most effectively.

It should be noted that the first portion 33a and the active portion 343a according to the embodiment overlap in plan view; however, for example, only some portions of the first portion 33a and the active portion 343a may overlap in plan view. The second portion 33b and the non-active portion 343b overlap in plan view; however, for example, a portion of the second portion 33b may overlap the active portion 343a.

In the example illustrated in FIG. 5, the surface 302a of the first portion 33a and the surface 302b of the second portion 33b are located at the same position in the Z1 direction. Accordingly, the surface 302a and the surface 302b constitute a continuous flat surface with no step. The surface 302a and the surface 302b located at the same position in the Z1 direction have no step between the surface 302a and the surface 302b, and thus the components of the piezoelectric element 34 can be readily formed homogeneously compared with a structure having steps.

The surface 302a and the surface 302b may be located in different positions in the Z1 direction. In other words, the surface 302a and the surface 302b may have a step between the surfaces. In such a case, the step should not cause cracking in the piezoelectric element 34 during the film formation process of the piezoelectric element 34.

The surface 303a of the insulating layer 332 of the first portion 33a and the surface 303b of the insulating layer 332 of the second portion 33b are located at the same position in the Z1 direction. Accordingly, the surface 303a and the surface 303b constitute a continuous flat surface with no step. In the example illustrated in FIG. 6, the surface 301 has steps, whereas the surface 303 has no step. The surface 303 having no step suppresses a decrease in stiffness of the insulating layer 332 compared with a structure in which the surface 303 has steps. Accordingly, the elastic layer 331 having the recessed portion 338 and the insulating layer 332 having no recessed portion enable the vibrating plate 33 to have increased deformation efficiency while suppressing a decrease in the stiffness of the vibrating plate 33. It should be noted that although the surface 303 is flat, the surface 303 may have a step.

The surface 301 having the recessed portion 338 enables the elastic layer 331 of the first portion 33a to have a thickness D11 in the Z1 direction that is greater than a thickness D21 of the elastic layer 331 of the second portion 33b in the Z1 direction as illustrated in FIG. 5. In contrast, the insulating layer 332 has no recessed portion, and thus a thickness D12 of the insulating layer 332 of the first portion 33a in the Z1 direction is the same as a thickness D22 of the insulating layer 332 of the second portion 33b in the Z1 direction. The insulating layer 332 having the same thicknesses D12 and D22 suppresses a decrease in the stiffness of the insulating layer 332 compared with a structure in which the thickness D12 and the thickness D22 are different.

The thickness of the elastic layer 331 in the Z1 direction, that is, an average thickness of the overall elastic layer 331, is greater than the thickness of the insulating layer 332 in the Z1 direction, that is, an average thickness of the overall insulating layer 332. The elastic layer 331 having an average thickness greater than the average thickness of the insulating layer 332 enables the recessed portion 338 of the elastic layer 331 to have a depth that is readily adjustable.

It should be noted that the average thickness of the elastic layer 331 may be less than or equal to the average thickness of the insulating layer 332. Although the depth of the recessed portion 338 is not limited to a particular depth, the depth of the recessed portion 338 may be less than or equal to half the average thickness of the overall elastic layer 331. With this structure, the deformation efficiency of the vibrating plate 33 can be increased while an excessive decrease in stiffness in the elastic layer 331 can be suppressed. In the example illustrated in FIG. 5, the elastic layer 331 has the recessed portion 338; however, the elastic layer 331 and the insulating layer 332 may have the recessed portion 338. In such a case, the recessed portion 338 may pass through the elastic layer 331 and the bottom of the recessed portion 338 may be provided on the insulating layer 332. Accordingly, in such a case, the insulating layer 332 may have the surface 301b.

The surface 301c of the third portion 33c in the Z1 direction is, in the Z1 direction, closer than the surface 301b of the second portion 33b in the Z1 direction, as illustrated in FIG. 6. A thickness D3 of the third portion 33c that overlaps the partition wall 321 in plan view is greater than the thickness D2 of the second portion 33b. The thickness D3 being greater than the thickness D2 suppresses a problem such as cracking from occurring between the third portion 33c and the second portion 33b compared with a structure in which the thickness D3 is less than or equal to the thickness D2.

In the example illustrated in FIG. 6, the surface 301c of the third portion 33c in the Z1 direction is, in the Z1 direction, closer than the surface 301a of the first portion 33a in the Z1 direction. As illustrated in FIG. 5, the thickness D1 of the first portion 33a is less than the thickness D3 of the third portion 33c. When the thickness D1 is greater than or equal to the thickness D3, the amount of movement of the first portion 33a in the Z1 direction due to bending becomes too large, and thus a load exerted on the second join portion 33e, which is a join portion between the vibrating plate 33 and the pressure chamber plate 32, increases, which may cause a problem such as cracking. The thickness D1 being greater than the thickness D3 suppresses a problem such as cracking from occurring compared with a structure in which the thickness D1 is greater than or equal to the thickness D3.

The thickness D1 of the first portion 33a is less than the thickness D3 of the third portion 33c. In the example illustrated in FIG. 5, the thickness D11 of the elastic layer 331 of the first portion 33a in the Z1 direction is less than a thickness D31 of the elastic layer 331 of the third portion 33c in the Z1 direction. In contrast, in the example illustrated in FIG. 5, the thickness D12 of the insulating layer 332 of the first portion 33a in the Z1 direction is the same as a thickness D32 of the insulating layer 332 of the third portion 33c in the Z1 direction. In this embodiment, the thicknesses D11, D21, and D31 are expressible as D21<D11<D31. The thickness D12, the thickness D22, and the thickness D32 are the same as each other.

The surface 301a of the first portion 33a in the Z1 direction and the surface 301b of the second portion 33b in the Z1 direction extend in the Y2 direction in cross-sectional view in the X1 direction. The surface 301d of the first join portion 33d in the Z1 direction extends in a third direction, which intersects the Z1 direction and the Y2 direction, in cross-sectional view in the X1 direction. In other words, the surface 301d of the first join portion 33d is an inclined surface that is inclined with respect to the surface 301a and the surface 301b. The first join portion 33d extending in the third direction suppresses a problem such as cracking from occurring between the first portion 33a and the second portion 33b compared with a structure in which the first join portion 33d extends, for example, in the Z2 direction.

Similarly, the surface 301c of the third portion 33c in the Z1 extends in the Y2 direction in cross-sectional view in the X1 direction. The surface 301e of the second join portion 33e in the Z1 direction extends in a direction intersecting the Z1 direction and the Y2 direction in cross-sectional view in the X1 direction. In other words, the surface 301e of the second join portion 33e is an inclined surface that is inclined with respect to the surface 301b and the surface 301c. The second join portion 33e extending in the direction intersecting the Z1 direction and the Y2 direction suppresses a problem such as cracking from occurring between the second portion 33b and the third portion 33c compared with a structure in which the second join portion 33e extends, for example, in the Z2 direction. It should be noted that although the first join portion 33d and the second join portion 33e are planar surfaces, the first join portion 33d and the second join portion 33e may be curved surfaces. For example, when the recessed portion 338 is formed by etching, depending on the type of etching, the first join portion 33d and the second join portion 33e may be curved.

The liquid discharge apparatus 100 including the above-described liquid discharge head 26 can achieve improved discharge characteristics by the operation of the above-described liquid discharge head 26 under the control of the control unit 20. The liquid discharge apparatus 100, accordingly, can achieve high-precision liquid discharging.

2. Second Embodiment

A second embodiment is described. In the following examples, the reference numerals used in the first embodiment will apply to components that function similarly to those in the first embodiment, and detailed descriptions of the components will be omitted as appropriate.

Figure 7:
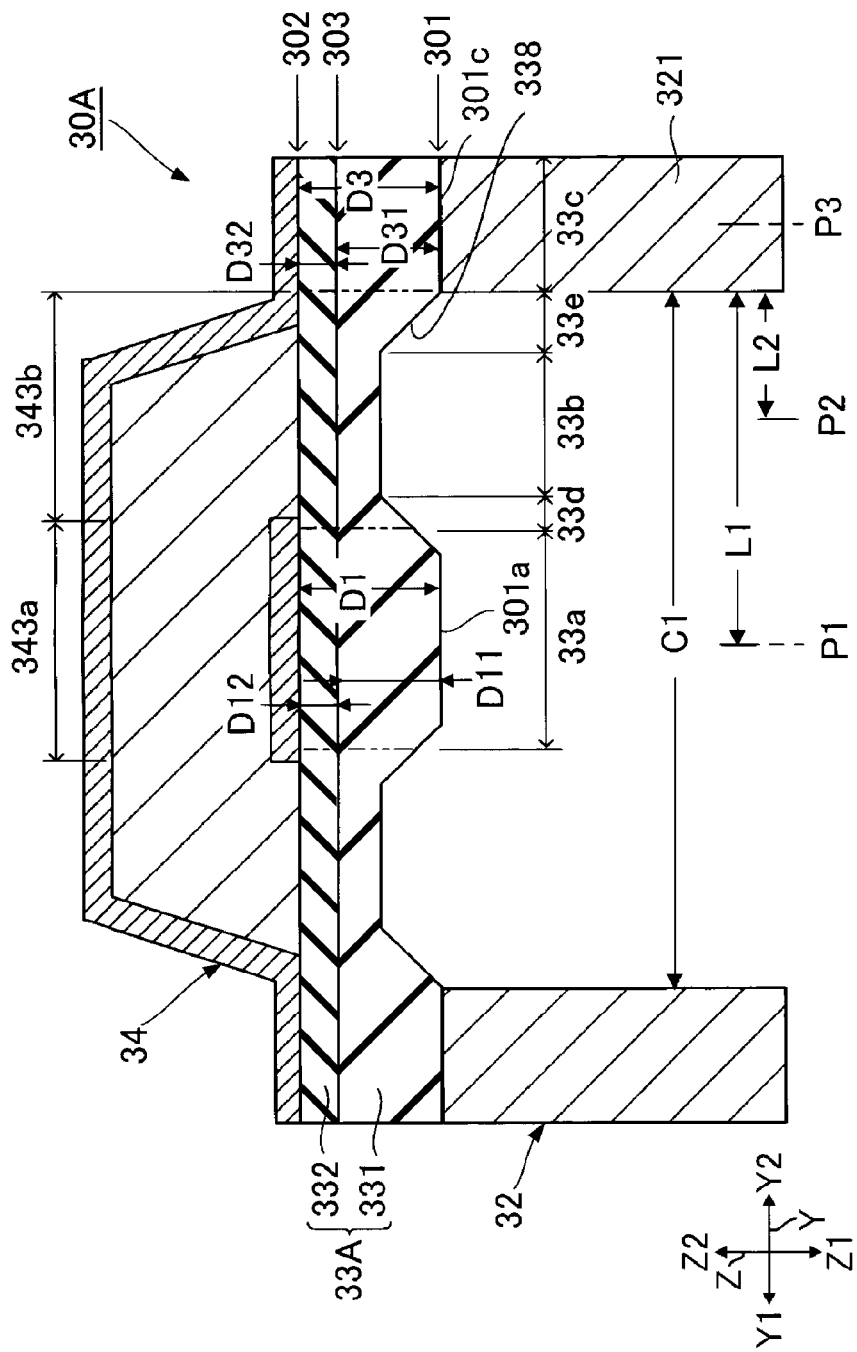
FIG. 7 is a cross-sectional view illustrating an actuator according to a second embodiment.

FIG. 7 is a cross-sectional view illustrating an actuator 30A according to the second embodiment. In the second embodiment, the actuator 30A is used instead of the actuator 30 according to the first embodiment. In the description of the actuator 30A below, features that differ from those of the actuator 30 according to the first embodiment are described and descriptions of similar features are omitted as appropriate.

In a vibrating plate 33A in the actuator 30A illustrated in FIG. 7, the surface 301a of the first portion 33a in the Z1 direction and the surface 301c of the third portion 33c in the Z1 direction are located at the same position in the Z1 direction. The thickness D1 of the first portion 33a in the Z1 direction is the same as the thickness D3 of the third portion 33c in the Z1 direction. The thickness D11 and the thickness D31 are the same. Such an actuator 30A can also achieve increased deformation efficiency of the vibrating plate 33A while suppressing a problem in the piezoelectric element 34 from occurring, similarly to the actuator 30 according to the first embodiment.

Additionally, the recessed portion 338 formed by etching enables the surface 301a and the surface 301c to be readily provided at the same position in the Z1 direction. Accordingly, the vibrating plate 33A having two portions of different thicknesses can be readily formed.

3. Third Embodiment

A third embodiment is described. In the following examples, the reference numerals used in the first embodiment will apply to components that function similarly to those in the first embodiment, and detailed descriptions of the components will be omitted as appropriate.

Figure 8:
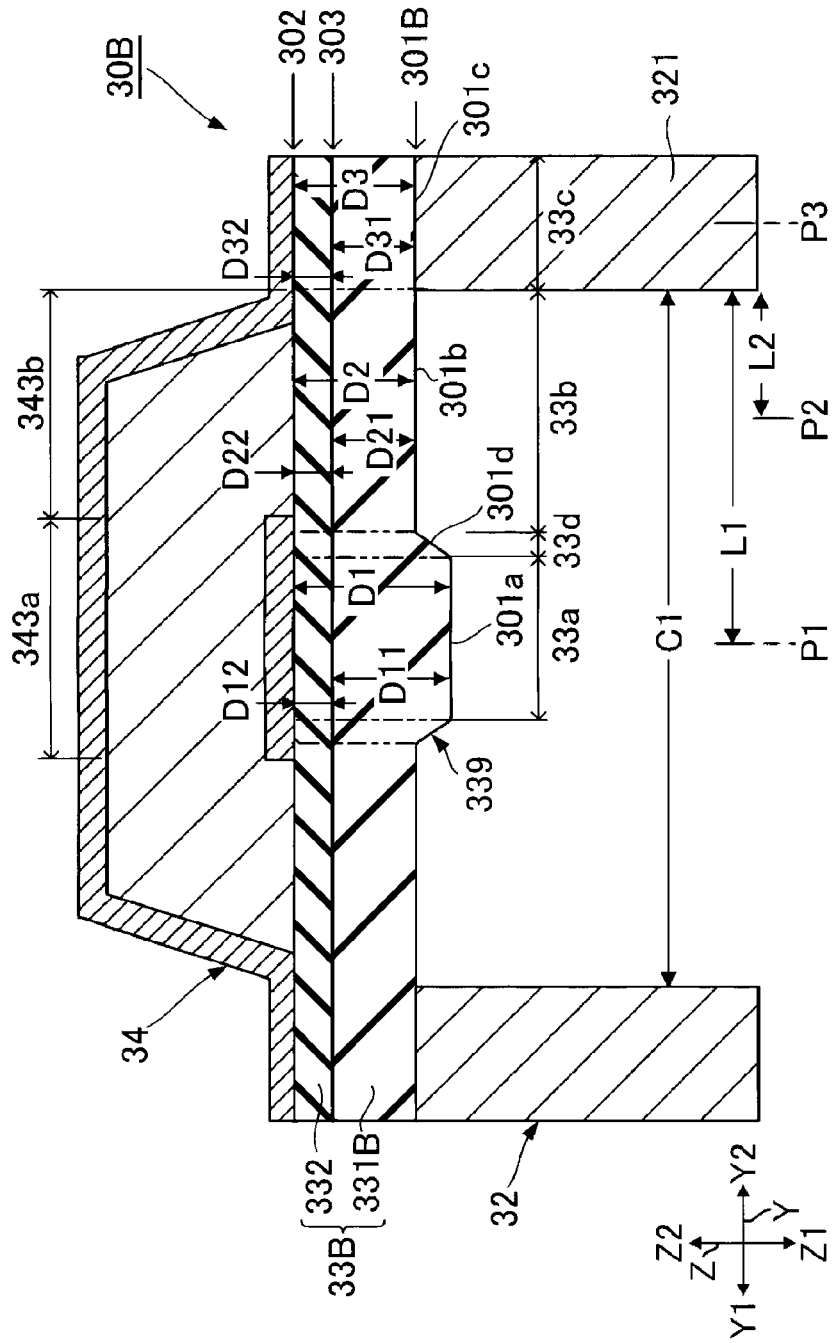
FIG. 8 is a cross-sectional view illustrating an actuator according to a third embodiment.

FIG. 8 is a cross-sectional view illustrating an actuator 30B according to the third embodiment. In the third embodiment, the actuator 30B is used instead of the actuator 30 according to the first embodiment. In the description of the actuator 30B below, features that differ from those of the actuator 30 according to the first embodiment are described and descriptions of similar features are omitted as appropriate.

In the example illustrated in FIG. 8, a surface 301B of a vibrating plate 33B has a convex portion 339. With this structure, the surface 301B of the vibrating plate 33B in the Z1 direction, that is, the surface 301B of an elastic layer 331B in the Z1 direction, has a step. The convex portion 339 corresponds to the first position P1 in the Y2 direction. The surface 301B has the convex portion 339 that corresponds to the first position P1, and thus, in the Z1 direction, the surface 301a of the first portion 33a in the Z1 direction is closer than the surface 301b of the second portion 33b in the Z1 direction. The convex portion 339 enables the first portion 33a to have the thickness D1 in the Z1 direction that is greater than the thickness D2 of the second portion 33b in the Z1 direction, as illustrated in FIG. 8. Such an actuator 30B can also achieve increased deformation efficiency of the vibrating plate 33B while suppressing a problem in the piezoelectric element 34 from occurring, similarly to the actuator 30 according to the first embodiment.

In the example illustrated in FIG. 8, the surface 301c of the third portion 33c in the Z1 direction and the surface 301b of the second portion 33b in the Z1 direction are located at the same position in the Z1 direction. The thickness D2 of the second portion 33b is the same as the thickness D3 of the third portion 33c. Accordingly, a problem such as cracking between the second portion 33b and the third portion 33c can be particularly suppressed from occurring. It should be noted that the surface 301c and the surface 301b are located at the same position in the Z1 direction, and in this embodiment, the second join portion 33e is omitted. Furthermore, the thickness D21 and the thickness D31 are the same in the example illustrated in FIG. 8.

4. Modifications

The above-described embodiments may be modified in various ways. Specific modifications applicable to the above-described embodiments will be described below. Two or more modifications selected from the following modifications may be combined as long as they are consistent with each other as appropriate. Modifications relating to the first embodiment may be applicable to the second embodiment, the third embodiment, and the modifications as long as they are consistent with each other.

4-1. First Modification

Figure 9:
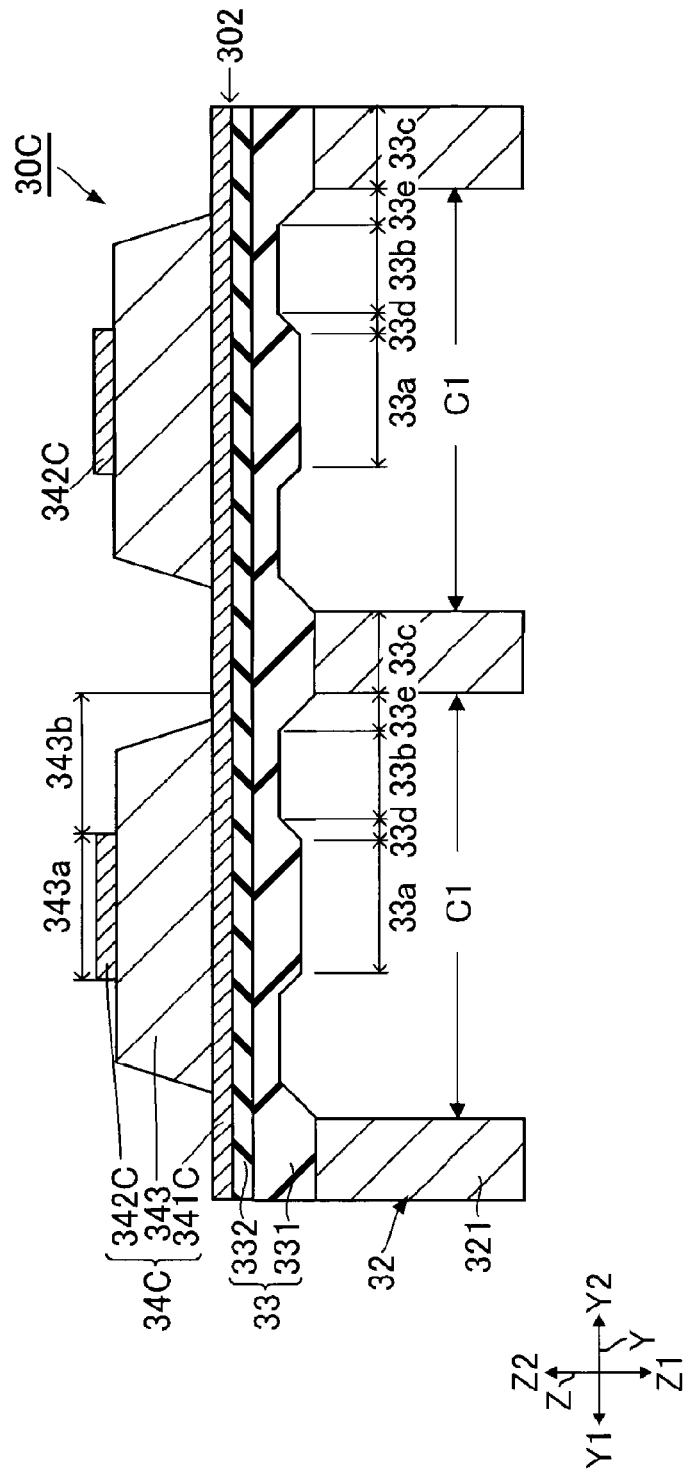
FIG. 9 is a cross-sectional view illustrating an actuator according to a first modification.

FIG. 9 is a cross-sectional view illustrating an actuator 30C according to a first modification. In a piezoelectric element 34C of the actuator 30C illustrated in FIG. 9, a first electrode 341C is common to pressure chambers C1, whereas second electrodes 342C are each provided to a corresponding one of the pressure chambers C1. In also such a piezoelectric element 34C, the components of the piezoelectric element 34C can be readily formed homogeneously with the surface 302 of the vibrating plate 33 having no step, compared with a structure having a step.

4-2. Second Modification

Figure 10:
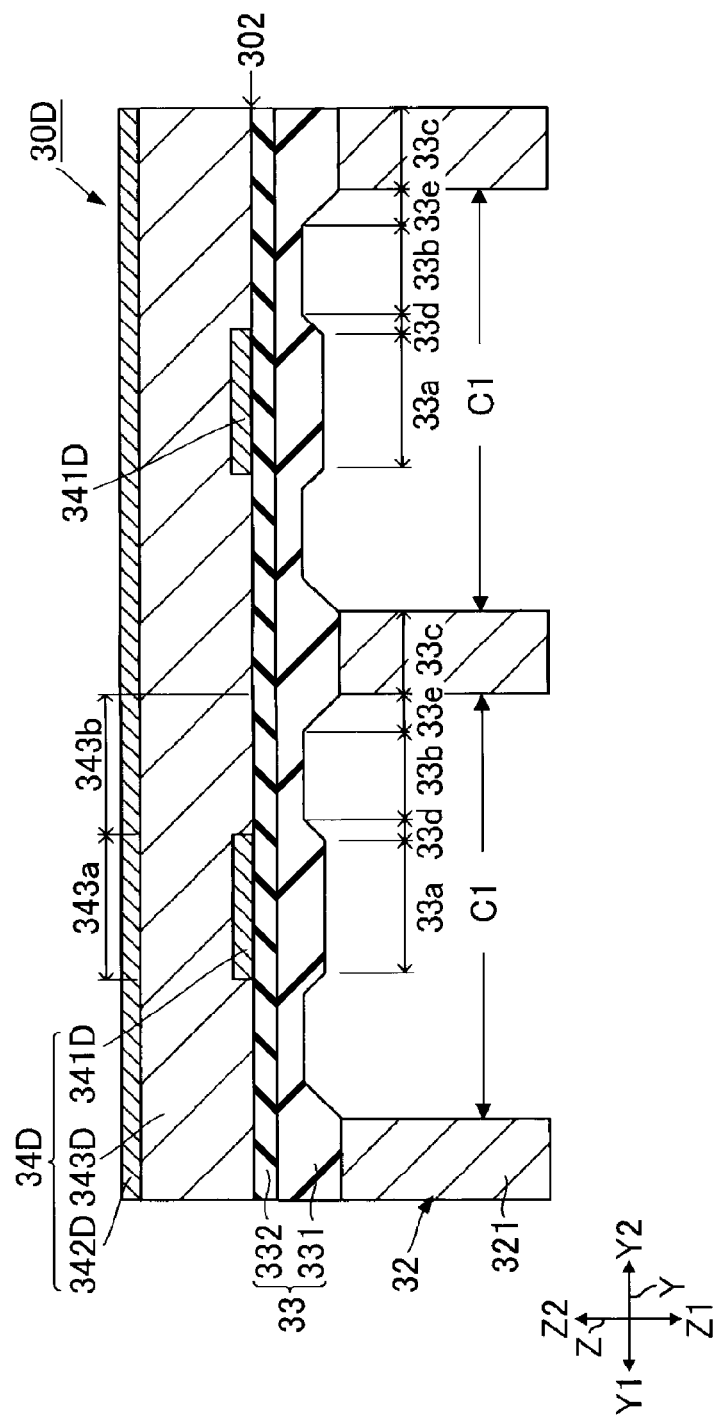
FIG. 10 is a cross-sectional view illustrating an actuator according to a second modification.

FIG. 10 is a cross-sectional view illustrating an actuator 30D according to a second modification. In a piezoelectric element 34D of the actuator 30D illustrated in FIG. 10, a piezoelectric layer 343D extends across a plurality of pressure chambers C1. More specifically, the piezoelectric layer 343D has no grooves G according to the first embodiment. First electrodes 341D are each provided to a corresponding one of the pressure chambers C1, whereas a second electrode 342D is common to the pressure chambers C1. A surface of the piezoelectric layer 343D in the Z2 direction is a flat surface, and thus the second electrode 342D is flat with no step. In also such a piezoelectric element 34D, the components of the piezoelectric element 34D can be readily formed homogeneously with the surface 302 of the vibrating plate 33 having no step, compared with a structure having a step.

4-3. Third Modification

Figure 11:
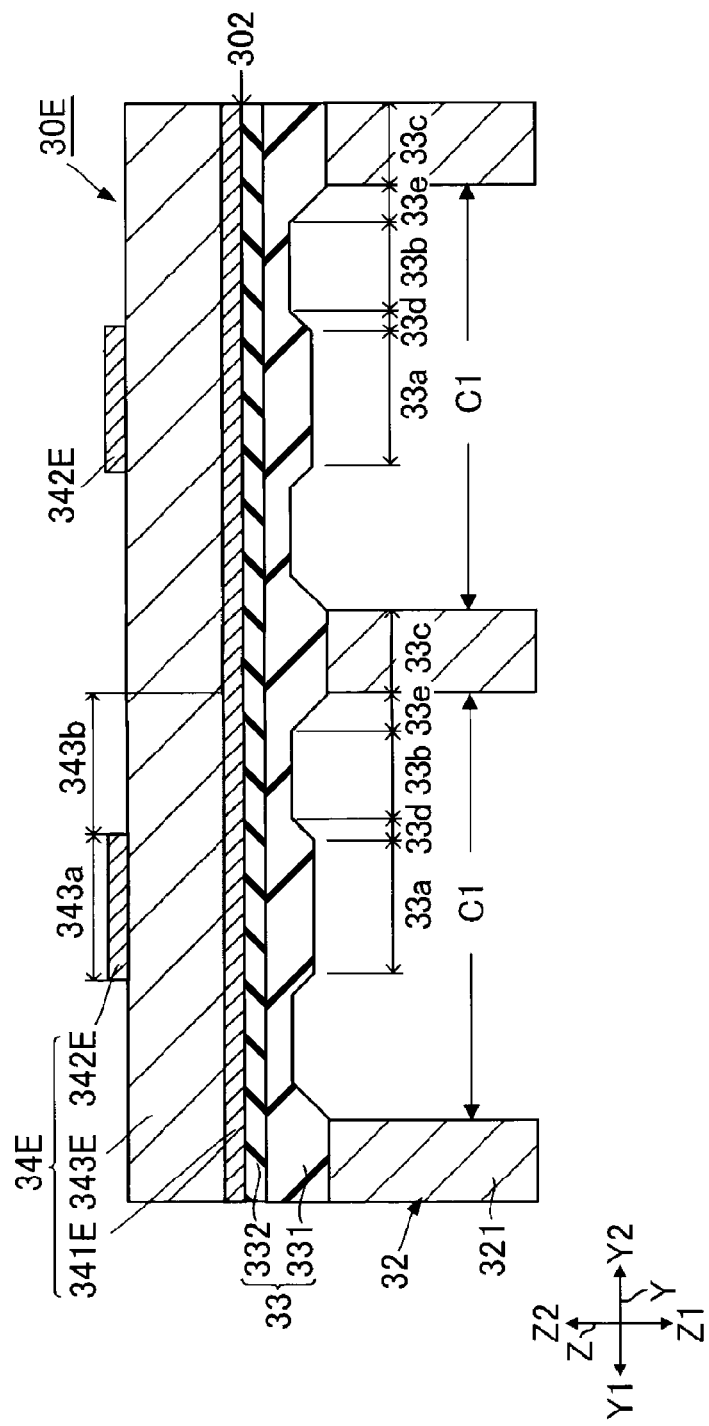
FIG. 11 is a cross-sectional view illustrating an actuator according to a third modification.

FIG. 11 is a cross-sectional view illustrating an actuator 30E according to a third modification. In a piezoelectric element 34E of the actuator 30E illustrated in FIG. 11, a piezoelectric layer 343E extends across a plurality of pressure chambers C1. More specifically, the piezoelectric layer 343E has no grooves G according to the first embodiment. A first electrode 341E is common to the pressure chambers C1, whereas second electrodes 342E are each provided to a corresponding one of the pressure chambers C1. In also such a piezoelectric element 34E, the components of the piezoelectric element 34E can be readily formed homogeneously with the surface 302 of the vibrating plate 33 having no step, compared with a structure having a step.

4-4. Other Modifications

In the first embodiment, the first electrodes 341 are each provided to a corresponding one of the pressure chambers C1, and the second electrode 342 is common to the pressure chambers C1; however, both the first electrodes 341 and the second electrode 342 may be individual electrodes.

Although the serial-type liquid discharge apparatus 100 that reciprocates the transport member 242 having the liquid discharge head 26 mounted thereon has been described in the first embodiment, the embodiments of the present disclosure may be applicable to a line-type liquid discharge apparatus that includes a plurality of nozzles N that cover the entire width of a medium 12.

The liquid discharge apparatus 100 according to the first embodiment may be employed in devices dedicated for printing and in a variety of devices such as facsimile apparatuses and copying machines. It should be noted that the application of the liquid discharge apparatus according to the embodiments of the present disclosure is not limited to printing. For example, the liquid discharge apparatus that discharges a solution of coloring material may be used as a manufacturing apparatus for producing color filters for display apparatuses such as liquid crystal display panels. The liquid discharge apparatus that discharges a solution of conductive material may be used as a manufacturing apparatus for producing wires and electrodes of wiring boards. The liquid discharge apparatus that discharges a solution of bioorganic material may be used, for example, as a manufacturing apparatus for manufacturing biochips.

The actuator 30 according to the first embodiment is not limited to the actuator mounted to the liquid discharge head and may be applicable to actuators mounted to other devices. Such devices include, for example, ultrasonic devices such as ultrasonic transmitters, ultrasonic motors, pressure sensors, and pyroelectric sensors.

What is claimed is:

1. A liquid discharge head comprising:
   piezoelectric elements;
   a vibrating plate disposed at a position below the piezoelectric elements in a first direction; and
   a pressure chamber plate disposed at a position below the vibrating plate in the first direction, the pressure chamber plate having a partition wall defining pressure chambers, wherein
   in the respective pressure chambers, when one of two positions in a second direction intersecting the first direction is defined as a first position and the other position is defined as a second position from which the shortest distance to the partition wall is shorter than the shortest distance from the first position to the partition wall,
   the vibrating plate has a first portion corresponding to the first position and a second portion corresponding to the second position,
   a surface of the first portion in the first direction is, in the first direction, closer than below a surface of the second portion in the first direction,
   a thickness of the first portion in the first direction is greater than a thickness of the second portion in the first direction.

2. The liquid discharge head according to claim 1, wherein a surface of the first portion in a direction opposite to the first direction and a surface of the second portion in the direction opposite to the first direction are located at the same position in the first direction.

3. A liquid discharge head comprising:
   piezoelectric elements;
   a vibrating plate disposed at a position below the piezoelectric elements in a first direction; and
   a pressure chamber plate disposed at a position below the vibrating plate in the first direction, the pressure chamber plate having a partition wall defining pressure chambers, wherein
   in the respective pressure chambers, when one of two positions in a second direction intersecting the first direction is defined as a first position and the other position is defined as a second position from which the shortest distance to the partition wall is shorter than the shortest distance from the first position to the partition wall,
   the vibrating plate has a first portion corresponding to the first position and a second portion corresponding to the second position,
   a surface of the first portion in the first direction is, in the first direction, below a surface of the second portion in the first direction,
   the vibrating plate includes an elastic layer and an insulating layer having a composition different from that of the elastic layer, the insulating layer being disposed above the elastic layer in the direction opposite to the first direction,
   a surface of the elastic layer of the first portion in the first direction is, in the first direction, closer than a surface of the elastic layer of the second portion in the first direction, and
   a surface of the insulating layer of the first portion in the first direction and a surface of the insulating layer of the second portion in the first direction are located at the same position in the first direction.

4. The liquid discharge head according to claim 3, wherein a thickness of the elastic layer in the first direction is greater than a thickness of the insulating layer in the first direction.

5. The liquid discharge head according to claim 3, wherein a thickness of the elastic layer of the first portion in the first direction is greater than a thickness of the elastic layer of the second portion in the first direction, and
   a thickness of the insulating layer of the first portion in the first direction is the same as a thickness of the insulating layer of the second portion in the first direction.

6. A liquid discharge head comprising:
   piezoelectric elements;
   a vibrating plate disposed at a position below the piezoelectric elements in a first direction; and
   a pressure chamber plate disposed at a position below the vibrating plate in the first direction, the pressure chamber plate having a partition wall defining pressure chambers, wherein
   in the respective pressure chambers, when one of two positions in a second direction intersecting the first direction is defined as a first position and the other position is defined as a second position from which the shortest distance to the partition wall is shorter than the shortest distance from the first position to the partition wall,
   the vibrating plate has a first portion corresponding to the first position and a second portion corresponding to the second position,
   a surface of the first portion in the first direction is, in the first direction, below a surface of the second portion in the first direction,
   when a position the same as the partition wall in the second direction is defined as a third position,
   the vibrating plate has a third portion corresponding to the third position, and
   a surface of the third portion in the first direction is, in the first direction, below a surface of the second portion in the first direction.

7. The liquid discharge head according to claim 6, wherein the surface of the third portion in the first direction and the surface of the first portion in the first direction are located at the same position in the first direction.

8. The liquid discharge head according to claim 6, wherein the surface of the third portion in the first direction is, in the first direction, below the surface of the first portion in the first direction.

9. The liquid discharge head according to claim 1, wherein when a position the same as the partition wall in the second direction is defined as a third position,
   the vibrating plate has a third portion corresponding to the third position, and
   a surface of the third portion in the first direction and the surface of the second portion in the first direction are located at the same position in the first direction.

10. The liquid discharge head according to claim 1, wherein the vibrating plate has a join portion that joins the first portion and the second portion, the surface of the first portion in the first direction extends in the second direction, the surface of the second portion in the first direction extends in the second direction, and a surface of the join portion in the first direction extends in a third direction intersecting the first direction and the second direction.

11. The liquid discharge head according to claim 1, wherein the piezoelectric element includes a first electrode, a second electrode, and a piezoelectric layer configured to deform in response to application of a voltage to at least one of the first electrode and the second electrode, the second electrode, the piezoelectric layer, and the first electrode are disposed in this order in the first direction, the piezoelectric layer has an active portion that is between the first electrode and the second electrode and has a non-active portion that is not between the first electrode and the second electrode, at least a portion of the first portion is located at the same position as the active portion in the second direction, and at least a portion of the second portion is located at the same position as the non-active portion in the second direction.

12. The liquid discharge head according to claim 11, wherein the first electrode is disposed individually for each of the pressure chambers, and the second electrode is common to the pressure chambers.

13. The liquid discharge head according to claim 11, wherein the first electrode is common to the pressure chambers, and the second electrode is disposed individually for each of the pressure chambers.

14. The liquid discharge head according to claim 11, wherein the piezoelectric layer extends across the pressure chambers.

15. A liquid discharge apparatus comprising:

the liquid discharge head according to claim 1, and a controller configured to control discharge operation of the liquid discharge head.

\* \* \* \* \*